US007906991B2

(12) United States Patent
Bertin

(10) Patent No.: US 7,906,991 B2
(45) Date of Patent: Mar. 15, 2011

(54) NANOTUBE-BASED LOGIC DRIVER CIRCUITS

(75) Inventor: Claude L. Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 799 days.

(21) Appl. No.: 11/897,812

(22) Filed: Aug. 31, 2007

(65) Prior Publication Data

US 2010/0072957 A1 Mar. 25, 2010

Related U.S. Application Data

(63) Continuation of application No. 11/653,673, filed on Jan. 16, 2007, now Pat. No. 7,265,575, which is a continuation of application No. 11/033,216, filed on Jan. 10, 2005, now Pat. No. 7,164,744.

(60) Provisional application No. 60/581,074, filed on Jun. 18, 2004.

(51) Int. Cl.
*H03K 19/20* (2006.01)
(52) U.S. Cl. ................... 326/104; 326/6; 326/7
(58) Field of Classification Search .......... None
See application file for complete search history.

(56) References Cited

U.S. PATENT DOCUMENTS

| | | | |
|---|---|---|---|
| 4,979,149 A | 12/1990 | Popovic et al. | |
| 6,128,214 A | 10/2000 | Kuekes et al. | |
| 6,256,767 B1 | 7/2001 | Kuekes et al. | |
| 6,314,019 B1 | 11/2001 | Kuekes et al. | |
| 6,445,006 B1 | 9/2002 | Brandes et al. | |
| 6,548,841 B2 | 4/2003 | Frazier et al. | |
| 6,574,130 B2 | 6/2003 | Segal et al. | |
| 6,643,165 B2 | 11/2003 | Segal et al. | |
| 6,706,402 B2 | 3/2004 | Rueckes et al. | |
| 6,707,098 B2 | 3/2004 | Hofmann et al. | |
| 6,759,693 B2 | 7/2004 | Vogeli et al. | |

(Continued)

FOREIGN PATENT DOCUMENTS

GB 2 364 933 A 2/2002

(Continued)

OTHER PUBLICATIONS

Javey et al., "High-k dielectrics for advanced carbon-nanotube transistors and logic gates", Dec. 2002, Nature Material, pp. 241-246.*

(Continued)

*Primary Examiner* — Anh Q Tran
(74) *Attorney, Agent, or Firm* — Wilmer Cutler Pickering Hale and Dorr LLP

(57) ABSTRACT

Nanotube based logic driver circuits. These include pull-up driver circuits, push-pull driver circuits, tristate driver circuits, among others. Under one embodiment, an off-chip driver circuit includes a differential input having first and second signal links, each coupled to a respective one of two differential, on-chip signals. At least one output link is connectable to an off-chip impedance load, and at least one switching element has an input node, an output node, a nanotube channel element, and a control structure disposed in relation to the nanotube channel element to controllably form and unform an electrically conductive channel between said input node and said output node. The input node is coupled to a reference signal and the control structure is coupled to the first and second signal links. The output node is coupled to the output link, and the channel element is sized to carry sufficient current to drive said off-chip impedance load.

16 Claims, 10 Drawing Sheets

U.S. PATENT DOCUMENTS

| | | |
|---|---|---|
| 6,803,840 B2 | 10/2004 | Hunt et al. |
| 6,809,465 B2 | 10/2004 | Jin |
| 6,835,591 B2 | 12/2004 | Rueckes et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,990,009 B2 | 1/2006 | Bertin et al. |
| 7,015,500 B2 | 3/2006 | Choi et al. |
| 7,115,901 B2 | 10/2006 | Bertin |
| 7,115,960 B2 | 10/2006 | Bertin et al. |
| 7,161,403 B2 | 1/2007 | Bertin |
| 7,164,744 B2 | 1/2007 | Bertin |
| 7,259,410 B2 | 8/2007 | Jaiprakash et al. |
| 7,265,575 B2 | 9/2007 | Bertin |
| 7,335,395 B2 | 2/2008 | Ward et al. |
| 7,560,136 B2 | 7/2009 | Ward et al. |
| 7,566,478 B2 | 7/2009 | Ward et al. |
| 2001/0023986 A1 | 9/2001 | Mancevski |
| 2002/0175390 A1 | 11/2002 | Goldstein et al. |
| 2003/0021966 A1 | 1/2003 | Segal et al. |
| 2003/0124325 A1 | 7/2003 | Rueckes et al. |
| 2003/0124837 A1 | 7/2003 | Rueckes et al. |
| 2003/0200521 A1 | 10/2003 | DeHon et al. |
| 2004/0238907 A1 | 12/2004 | Pinkerton et al. |
| 2005/0056877 A1 | 3/2005 | Rueckes et al. |
| 2006/0237537 A1 | 10/2006 | Empedocles et al. |

FOREIGN PATENT DOCUMENTS

| | | |
|---|---|---|
| WO | WO-00/48195 | 8/2000 |
| WO | WO-01/03208 A1 | 1/2001 |

OTHER PUBLICATIONS

Bachtold et al., "Logic circuits based on carbon nanotubes", 2003, Physica E, pp. 42-46.*

Avouris, P., et al., "Carbon Nanotube Electronics," Chemical Physics, 2002, vol. 284, pp. 429-445.

Bachtold, A. et al., "Logic Circuits with Carbon Nanotube Transistors", Science, Nov. 9, 2001, vol. 294, pp. 1317-1320.

Derycke, V., et al., "Carbon Nanotube Inter- and Intramolecular Logic Gates," Nano Letters, Sep. 2001, vol. 1, No. 9, pp. 453-456.

Huang, Y., et al,, "Logic Gates and Computation from Assembled Nanowire Building Blocks," Science, Nov. 9, 2001, vol. 294, pp. 1313-1316.

Javey, A., et al., "Carbon Nanotube Transistor Arrays for Multistage Complementary Logic and Ring Oscillators," Nano Letters, 2002, vol. 2 , No. 9, pp. 929-932.

Martel, R., et al, "Carbon Nanotube Field-Effect Transistors and Logic Circuits," DAC 2002, Jun. 10-12, 2002, vol. 7.4, pp. 94-98.

Chen, J. et al., "Self-aligned carbon nanotube transistors with charge transfer doping", Applied Physics Letters, vol. 86, pp. 123108-1-123108-3, 2005.

Chen, J. et al., "Self-aligned Carbon Nanotube Transistors with Novel Chemical Doping", IEDM, pp. 29.4.1-29.4.4, 2004.

Duan, X. et al., "Nonvolatile Memory and Programmable Logic from Molecule-Gated Nanowires", Nano Letters, vol. 0, No. 0, pp. A-D, 2002.

Heinze, S. et al., "Carbon Nanotubes as Schottky Barrier Transistsors", Physical Review Letters, vol. 89, No. 10, pp. 16801-1-106801-4, 2002.

Javey, A. et al., "Carbon Nanotube Field-Effect Transistors with Integrated Ohmic Contacts and High-k Gate Dielectrics", Nano Letters, vol. 4, No. 3, pp. 447-450, 2004.

Radosavljevic, M. et al., "Nonvolatile Molecular Memory Elements Based on Ambipolar Nanotube Field Effect Transistors", Nano Letters, vol. 2, No. 7, pp. 761-764, 2002.

Wind, S. J. et al., "Fabrication and Electrical Characterization of Top Gate Single-Wall Carbon Nanotube Field-Effect Transistors", 14 pages.

Wind, S. J. et al., "Vertical scaling of carbon nanotube field-effect transistors using top gate electrodes", Applied Physics Letters, vol. 80, No. 20, pp. 3817-3819, May 20, 2002.

Javey, A. et al., "High-k dielectrics for advanced carbon-nanotube transistors and logic gates", Nature Materials, vol. 1, pp. 241-246, Dec. 2002.

Rueckes, et al., "Carbon nanotube-based nonvolatile random access memory for molecular computing", Science, vol. 289, pp. 94-97, Jul. 7, 2000.

Derycke, et al., "Controlling Doping and Carrier Injection in Carbon Nanotube Transistors," Applied Physics Letters, vol. 80, No. 15, Apr. 2002, pp. 2773-2775.

International Search Report and Written Opinion of the International Searching Authority, The United States Patent and Trademark Office, for PCT/US2005/018538, dated Jul. 31, 2006, 6 pages.

Lin, et al., "Novel Carbon Nanotube FET Design with Tunable Polarity," IEEE, 2004, 4 pages.

* cited by examiner

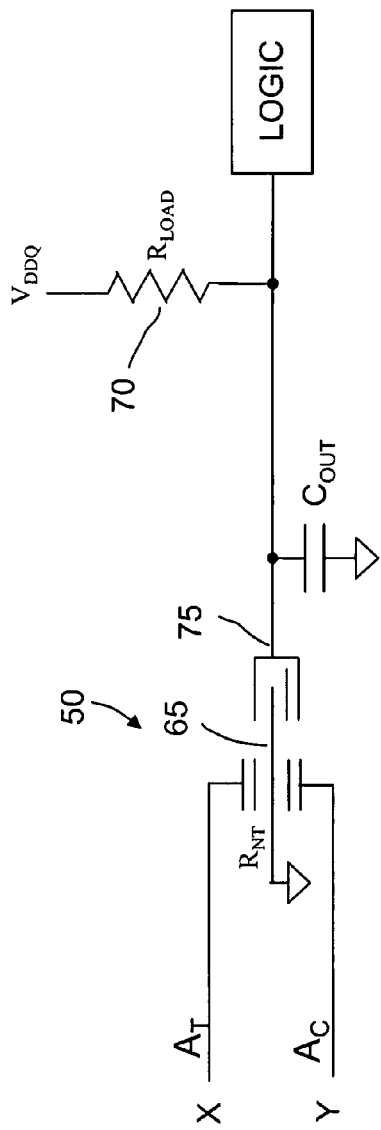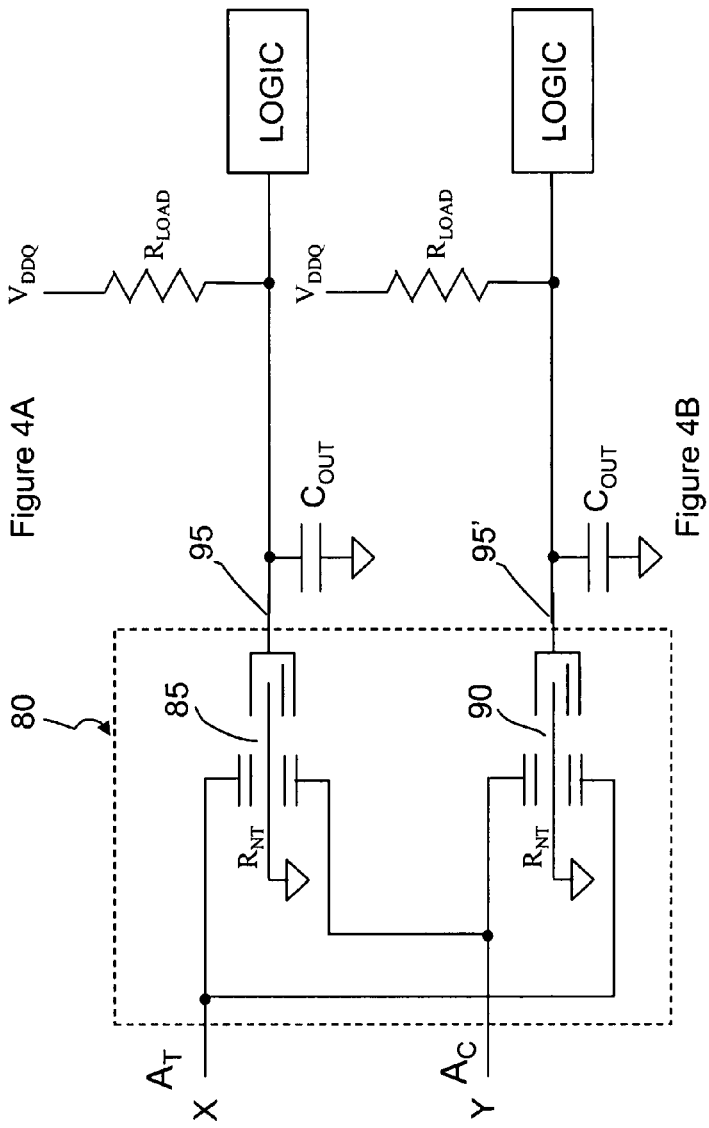
Figure 4A
Figure 4B

NANOTUBE-BASED LOGIC DRIVER CIRCUITS

CROSS-REFERENCE TO RELATED APPLICATIONS

This application is a continuation of and claims priority under 35 U.S.C. §120 to U.S. patent application Ser. No. 11/653,673, filed on Jan. 16, 2007, entitled Nanotube-based Logic Driver Circuits, which is a continuation of and claims priority under 35 U.S.C. §120 to U.S. patent application Ser. No. 11/033,216, filed on Jan. 10, 2005, entitled Nanotube-based Logic Driver Circuits, which claims priority under 35 U.S.C. §119(e) to U.S. Provisional Patent Application No. 60/581,074, filed on Jun. 18, 2004, entitled Nonvolatile Carbon Nanotube Logic (NLOGIC) Off Chip Driver, all of which are incorporated herein by reference in their entirety.

This application is related to the following references:

U.S. patent application Ser. No. 10/917,794, now U.S. Pat. No. 7,115,960, filed on Aug. 13, 2004, entitled Nanotube-Based Switching Elements;

U.S. patent application Ser. No. 10/918,085, now U.S. Pat. No. 6,990,009, filed on Aug. 13, 2004, entitled Nanotube-Based Switching Elements With Multiple Controls;

U.S. patent application Ser. No. 10/918,181, now U.S. Pat. No. 7,071,023, filed on Aug. 13, 2004, entitled Nanotube Device Structure And Methods Of Fabrication;

U.S. patent application Ser. No. 10/917,893, now U.S. Pat. No. 7,138,832, filed on Aug. 13, 2004, entitled Nanotube-Based Switching Elements And Logic Circuits;

U.S. patent application Ser. No. 10/917,606, filed on Aug. 13, 2004, entitled Isolation Structure For Deflectable Nanotube Elements;

U.S. patent application Ser. No. 10/917,932, filed on Aug. 13, 2004, entitled Circuits Made From Nanotube-Based Switching Elements With Multiple Controls;

U.S. patent application Ser. No. 11/033,087, filed on Jan. 10, 2005, entitled Nanotube-Based Transfer Devices and Related Circuits;

U.S. patent application Ser. No. 11/033,089, filed on Jan. 10, 2005, entitled Integrated Nanotube and Field Effect Switching Device;

U.S. patent application Ser. No. 11/033,213, filed on Jan. 10, 2005, entitled Receiver Circuit Using Nanotube-Based Switches and Transistors;

U.S. patent application Ser. No. 11/033,215, filed on Jan. 10, 2005, entitled Receiver Circuit Using Nanotube-based Switches and Logic;

U.S. patent application Ser. No. 11/032,983, filed on Jan. 10, 2005, entitled Storage Elements Using Nanotube Switching Elements; and U.S. patent application Ser. No. 11/032,823, now U.S. Pat. No. 7,167,026, filed on Jan. 10, 2005, entitled Tri-State Circuit Using Nanotube Switching Elements.

BACKGROUND

1. Technical Field

The present application generally relates to nanotube switching circuits and in particular to nanotube switching circuits used in driver circuits capable of driving relatively high capacitive loads.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or heavy radiation. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to heavy radiation because the radiation generates electrical currents inside the semiconductor material. It is possible to manufacture integrated circuits with special devices and isolation techniques so that they remain operational when exposed to heavy radiation, but the high cost of these devices limits their availability and practicality. In addition, radiation hardened digital circuits exhibit timing differences from their normal counterparts, requiring additional design verification to add radiation protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Resistance to radiation and the ability to function correctly at elevated temperatures also expand the applicability of digital logic. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electro-mechanical switches based on carbon nanotubes (including mono-layers constructed thereof) and metal electrodes has been detailed in a previous patent application of Nantero, Inc. (U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341,054, 10/341,130, 10/776,059, and 10/776,572, the contents of which are hereby incorporated by reference in their entireties).

SUMMARY

The invention provides nanotube based logic driver circuits. These include pull-up driver circuits, push-pull driver circuits, tristate driver circuits, among others.

Under one aspect of the invention, an off-chip driver circuit includes a differential input having a first and second signal links, each coupled to a respective one of two differential, on-chip signals. At least one output link is connectable to an off-chip impedance load, and at least one switching element has an input node, an output node, a nanotube channel element, and a control structure disposed in relation to the nanotube channel element to controllably form and unform an electrically conductive channel between said input node and said output node. The input node is coupled to a reference signal and the control structure is coupled to the first and second signal links. The output node is coupled to the output link, and the nanotube channel element is sized to carry sufficient current to drive said off-chip impedance load.

Under another aspect of the invention, the output link is coupled to a pull-up resistive load coupled to a supply voltage.

Under another aspect of the invention, the supply voltage coupled to the resistive load is different than the supply voltage of a chip having the off-chip driver circuit.

Under another aspect of the invention, the off-chip driver circuit further includes a second switching element having an input node, an output node, a nanotube channel element, and a control structure disposed in relation to the nanotube channel element to controllably form and unform an electrically conductive channel between said input node and said output node; and further comprising a second output link connectable to a second off-chip impedance load. The input node of the second switching element is coupled to a reference signal and the control structure of the second switching element is coupled to the first and second signal links. The output node of the second switching element is coupled to the second output link, and the nanotube channel element of the second switching element is sized to carry sufficient current to drive the off-chip impedance load.

Under another aspect of the invention, an off-chip driver circuit includes a differential input having a first and second signal links, each coupled to a respective one of two differential, on-chip signals. At least one output link is connectable to an off-chip impedance load. At least first and second switching elements each have an input node, an output node, a nanotube channel element, and a control structure disposed in relation to the nanotube channel element to controllably form and unform an electrically conductive channel between said input node and said output node. The input node of the first switching element is coupled to a first reference signal and input node of the second switching element is coupled to a second reference signal. The control structure of each of the first and second switching elements is coupled to the first and second signal links and the output node of each of the first and second switching elements is coupled to the output link. The nanotube channel element of each of the first and second switching elements is sized to carry sufficient current to drive said off-chip impedance load.

Under another aspect of the invention, an off-chip driver circuit includes a differential input having a first and second signal links, each coupled to a respective one of two differential, on-chip signals. First and second output links are each connectable to an off-chip impedance load. The circuit further includes at least first and second push-pull drivers, each push-pull driver connected to the first and second input links and each connected to a respective one of the first and second output links. Each push-pull driver includes first and second switching elements, each having an input node, an output node, a nanotube channel element, and a control structure disposed in relation to the nanotube channel element to controllably form and unform an electrically conductive channel between said input node and said output node. The input node of the first switching element is coupled to a first reference signal and input node of the second switching element is coupled to a second reference signal. The control structure of each of the first and second switching elements is coupled to the first and second signal links and the output node of each of the first and second switching elements is coupled to a respective one of the output links. The nanotube channel element of each of the first and second switching elements is sized to carry sufficient current to drive said off-chip impedance load.

Under another aspect of the invention, an off-chip tristate driver circuit includes a differential input having a first and second signal links, each coupled to a respective one of two differential, on-chip signals. At least one output link is connectable to an off-chip impedance load. The circuit includes at least first and second switching elements, each having an input node, an output node, a nanotube channel element, and a control structure disposed in relation to the nanotube channel element to controllably form and unform an electrically conductive channel between said input node and said output node. The control structure of each of the first and second switching elements is coupled to the first and second signal links and the output node of each of the first and second switching elements is coupled to the output link. The nanotube channel element of each of the first and second switching elements is sized to carry sufficient current to drive said off-chip impedance load. The input node of the first switching element is coupled to a first reference signal through a first selection structure and the input node of the second switching element is coupled to a second reference signal through a second selection structure.

Under another aspect of the invention, the first and second selection structures are each switching elements having an input node connected to a respective one of the first and second reference signals, an output node connected to a respective input node of the first and second switching elements, a nanotube channel element, and a control structure disposed in relation to the nanotube channel element to controllably form and unform an electrically conductive channel between said input node and said output node, and the control structure is coupled of each selection structure is coupled to at least one selection signal.

BRIEF DESCRIPTION OF THE DRAWINGS

FIG. 4A is a single rail driver circuit according to certain embodiments;

FIG. 4B is a dual rail driver circuit according to certain embodiments;

DETAILED DESCRIPTION

Preferred embodiments of the invention arrange nanotube-based switches into driver circuits capable of driving relatively large capacitances, such as off chip (OC) capacitances, long or heavily loaded interconnect lines, etc. The circuits may be either dual-rail (differential) or single-rail, open carbon nanotube (CNT) output (corresponds to open drain in an FET), push pull drivers, and tristate push pull drivers, for example.

Carbon nanotube-based logic circuits, such as those circuits disclosed in the incorporated, related references, may be required to drive a relatively large capacitance, 10 pf for example, when driving off-chip, or when driving heavy loads on-chip. Nanotube-based logic circuits using porous carbon nanotube fabrics to construct nanotube channel elements are typically low capacitance circuits, e.g., 30 aF (0.030 fF) input and output capacitances, and can typically drive only relatively low capacitances. Preferably, a logic family includes circuits that can drive large capacitive loads, such as 10 pf.

Figure 1:
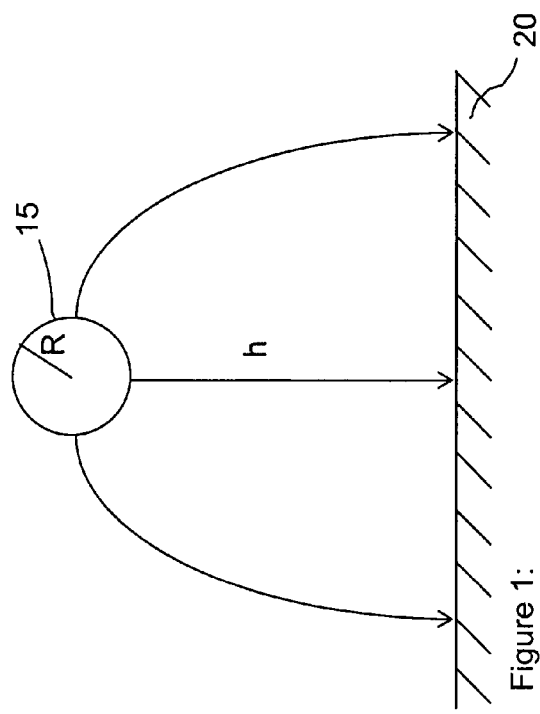
FIG. 1 is a transverse cross-sectional view of a nanotube in relation to a substrate.

FIG. 1 depicts in transverse cross-sectional view of a single nanotube 15 (e.g., carbon nanotube) of diameter 2R (typically 0.6 to 1.5 nm in diameter) and height h above a conductive region 20, where the conductive region is typically a control (or set) or a release electrode, such as disclosed in the incorporated, related references.

Figure 2:
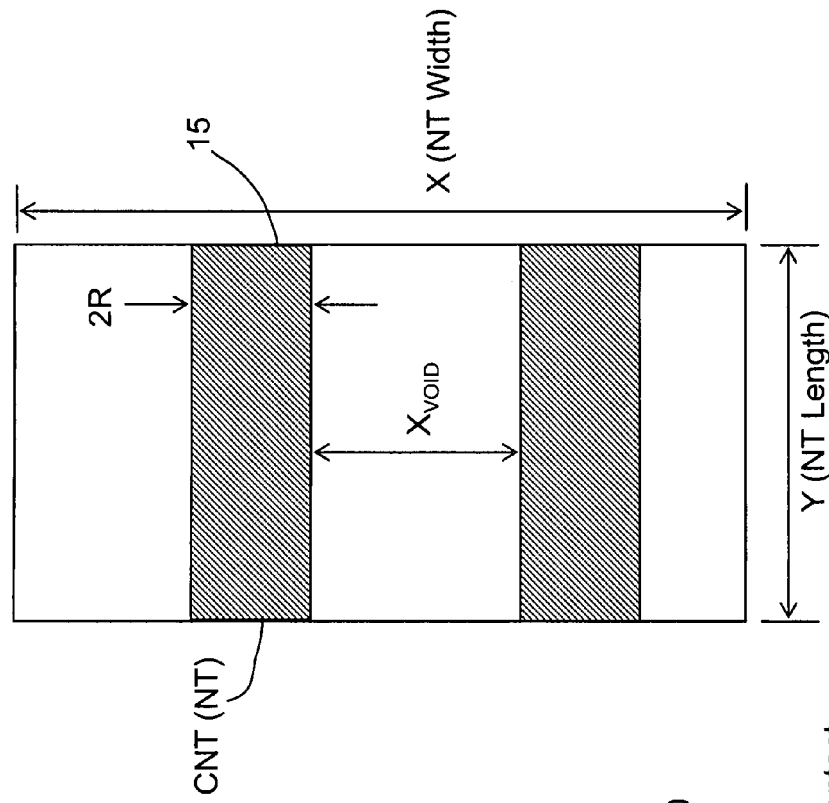
FIG. 2 is a plan view of two separated nanotubes.

FIG. 2 illustrates a plan view of two nanotube fibers 15 of diameter 2R and a void region XVOID between fibers in the porous nanotube fabric layer.

Figure 3:
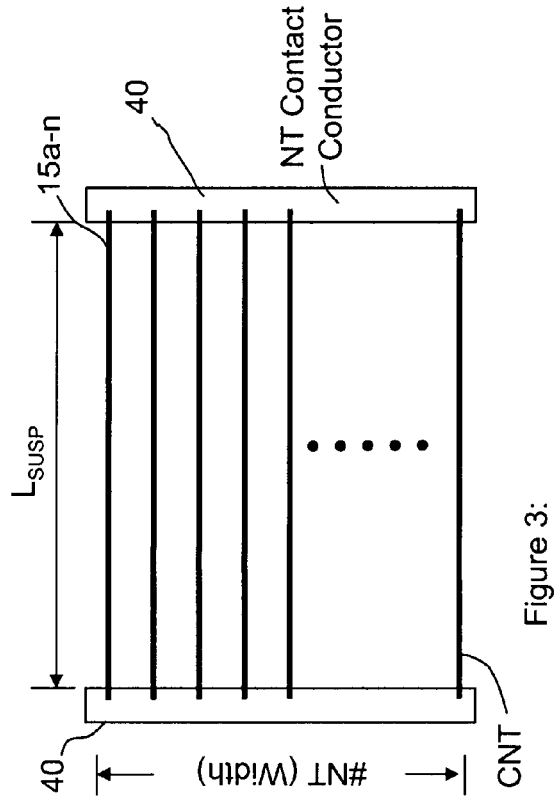
FIG. 3 is a plan view of a plurality of nanotubes suspended by contacts.

FIG. 3 illustrates a plan view of multiple carbon nanotubes, labeled 15$a$-$n$ of length LSUSP. The CNTs are suspended between NT contact conductors 40 to form the nanotube channel elements of exemplary carbon nanotube switches, such as those disclosed in the incorporated, related references. In this figure, the nanotubes are depicted as if they are aligned in parallel, but in preferred embodiments such alignment is not necessary and in many embodiments such strict parallel alignment is not expected. As described in the incorporated references, LSUSP for a modern implementation may be about 325 nm (0.325 μm), for example.

Present nanotube fabric densities may be approximately 10 nanotubes in a 200×200 nm region. A 325×325 nm region comprising a suspended length LSUSP=325 nm and width=325 nm contains approximately 15 NTs, for example. XVOID may be calculated using the equation 15(2R+XVOID)=325 nm, where 2R=1.5 nm, for example. XVOID is approximately equal to 20 nm, for example. For 2R=1.5 nm, and XVOID=20 nm, the nanotube fabric density is approximately 7% NTs with a 93% void region. In operation, the NT fibers are in contact with the insulator layer of a control or release electrodes (with a conductive element under the insulator layer). The control or release electrode conductor approximates ground plane 20 shown in FIG. 1.

Capacitance between the nanotube and the control or release electrodes is contributed by an approximately 65 nm portion of NT fiber length in close proximity to the electrodes. The insulator thickness is assumed to be approximately 15 nm (h=15 nm as shown in FIG. 1), and the dielectric is assumed to be $SiO_2$ with relative dielectric constant of approximately 4. The capacitance per nanotube is calculated using the following equation:

$$C = \pi \in l / \cos h^{-1}(1 + h/R), \text{ where } \cos h^{-1} = \pi \in l / \ln[(1 + h/R) + \{(1 + h/R)^2 - 1\}^{0.5}]$$

as given in Ramo, S. and Whinnery, J. R., *Fields and Waves in Modern Radio*, John Wiley and Sons, 1958 138-14. For 15 nanotubes in parallel, the nanotube electrostatic switch input capacitance is 30 aF (0.030 fF). Output capacitance and local wiring capacitance is estimated as also 30 aF.

The resistance of a nanotube nonvolatile electrostatic switch consists of a conductor to nanotube contact resistance Rc in series with a nanotube to output electrode conductor contact resistance (when the switch is in the "ON" state) of RSW. Nanotube switches (e.g., non-volatile) are typically symmetrical, and Rc consists of two contacts in parallel. RSW also uses two contacts in parallel. Each conductor to nanotube contact is approximately 20,000 Ohms, for example, and each switching contact is approximately 30,000 Ohms, for example. The total resistance between the nanotube contacts and the output contacts is approximately 25,000 Ohms per nanotube, for example. The resistance is dominated by contact resistance, so that the nanotube fiber resistance is negligible. For 15 parallel nanotubes, the nanotube resistance is approximately 1,700 ohms.

FIG. 4A illustrates a nanotube nonvolatile off chip driver (OCD) 50. The term off chip driver is used to refer to a circuit driving a heavy capacitive load, such as 10 pF for example, whether the load is on the same chip or on another chip. Driver 50 includes nanotube switching element 65 (more below) connected to output terminal 75 and drives a capacitive load COUT, and a pull-up resistor RLOAD 70 (COUT and RLOAD are not part of output driver 50) connected to power supply voltage VDDQ. The driver 50 is coupled to a logic circuit (a receiver, for example). Nanotube switching element 65 is driven by the outputs of a predriver stage at terminals X and Y, with true and complementary logic inputs AT and AC, respectively. The output 75 of nanotube switching element 65 is connected to capacitive load COUT, pull-up resistor RLOAD, and a logic input. The nanotube channel element (more below) is connected to ground as a reference via a signal electrode (more below when describing an exemplary nanotube switching element). Preferred embodiments form switching element 65 such that the nanotube channel element has a number of nanotubes to provide a resistance RNT between output and ground of approximately 60 Ohms. A switch with 15 nanotubes in parallel has a resistance of 1,700 Ohms, an input capacitance of approximately 30 aF (0.030 fF), and occupies a width of 302.5 nm (approximately 0.30 um). A switch with 425 parallel nanotubes has a resistance of approximately 60 ohms, an input capacitance of approximately 850 aF (0.85 fF), and occupies a width of 9,117.5 nm (approximately 9.12 um). The capacitance load COUT is approximately 10 pF, for example. The pull-up resistor RLOAD must be much larger than RNT, and is selected as 600 ohms, for example.

In operation, if input AT is at a positive voltage and AC is at ground, switching element 65 is turned "ON" (CLOSED), and output 75 is connected to ground through a 60 Ohm resistance (of the switch 65) discharging capacitor COUT. If COUT=10 pF, the discharge time constant RNTCOUT is approximately 600 ps, and the output fall time is less than 1.5 ns. Note that as long as output 75 is held at ground, a dc current will flow from power source VDDQ through resistor 70 and driver 65 to ground. The dc current is a consequence of the open-CNT output design, corresponding to an open-drain FET design and will be discussed further below. Note that output drivers are often powered by a dedicated power bus at a voltage referred to as VDDQ and other circuits in the chip by a separate power bus referred to as VDD in order to minimize on-chip-noise when switching large output driver circuits. VDDQ may be the same voltage as VDD or may be at a higher or lower voltage than VDD. Examples of VDD and VDDQ and are 5, 3.3, 2.5, and 1.8 volts.

In operation, if input AT is at zero volts and AC is a positive voltage, switch 65 is turned "OFF" (OPEN), and node 75 voltage rises to VDDQ as resistor RLOAD charges capacitor COUT. The charge time constant RLOADCOUT is 6 ns, and the output rise time is less than 15 ns. No dc current flows when output node 75 is in the open state.

The voltage applied to driver input terminals X and Y does not have to be equal to VDDQ. The driver input voltages applied to terminals X and Y may be 1.5 volts, for example, and VDDQ may be 3.3 volts, for example. Driver 50 may be used to drive a broad range of VDDQ voltage levels, from less than 1 volt to greater than 5 volts, for example.

FIG. 4B illustrates a dual-rail output driver 80. The circuit 80 includes nanotube switching elements 85 and 90, interconnected as shown, and has dual-rail (differential) inputs X and Y and dual-rail (differential) outputs 95 and 95'. Each output drives a capacitance load COUT, a resistor RLOAD, and a logic input. Each switching element 85 and 90 is sized as described above to provide appropriate drive (e.g., wide enough to have 425 nanotubes in parallel), and has an "ON" resistance of about 60 Ohms. The input capacitance at inputs X and Y is approximately 0.85 fF. The operation of nanotube switching elements 85 and 90 shown in FIG. 4B is the same as the operation of nanotube switch 65 shown in FIG. 4A and described earlier.

Output driver 50 and output driver 80 each require a pre-driver amplification stage. The output drivers use nanotube switches with 425 parallel nanotubes with an input capacitance of 0.85 if, while logic in this example typically uses nanotube switches with 15 parallel nanotubes, having an input capacitance of 0.030 ff. A pre-driver is used to drive output drivers 50 and 80. A pre-driver consists of a chain (several stages) of nanotube inverters of increasing size. The pre-driver uses enough stages so that the last pre-driver stage is strong enough to drive the input capacitance of the nanotube output driver. It is well known (G. E. Sobelman, "Advanced Digital Circuit Design", EE course printed notes, copyright 2001", pages 9-15, and H. B. Bakoglu, "Circuits, interconnections, and Packaging for VLSI", Addison-Wesley Publishing Co., 1990, pages 172-173) that in order to minimize the total delay along a pre-driver path, each pre-driver stage should carry approximately the same load, typically expressed as the same COUT/CIN capacitance ratio at each stage, with COUT/CIN in the 3 to 5 range.

Figure 5:
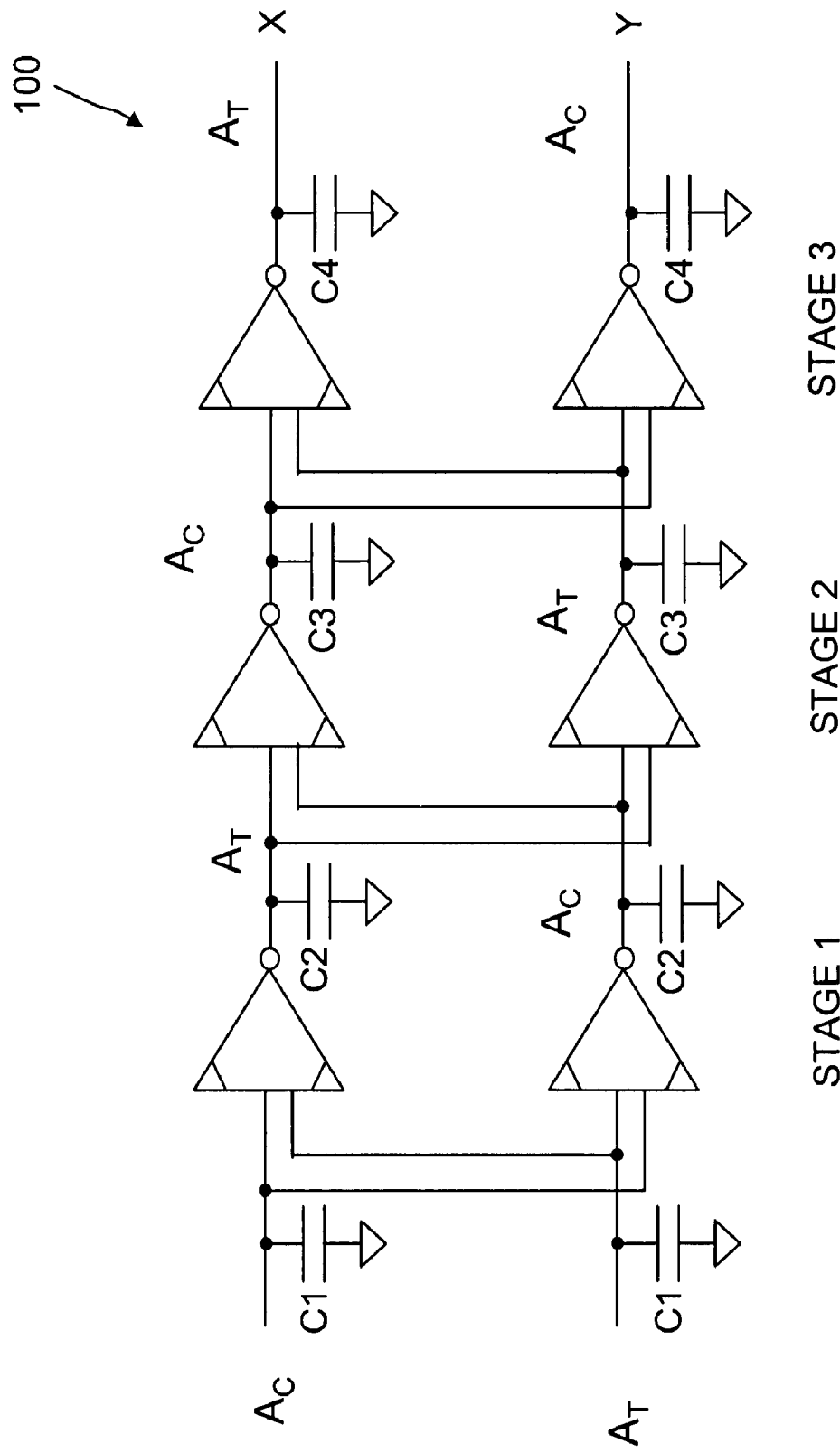
FIG. 5 depicts a pre-driver circuit that may be used in conjunction with a driver circuit according to certain embodiments of the invention.

FIG. 5 illustrates nanotube-based three-stage pre-driver 100. Each stage is composed of a dual-rail (differential) nanotube nonvolatile inverter logic stage with input and output loads indicated as C1-C4. The operation of dual-rail nanotube inverters is described in some of the incorporated, related references. The outputs X and Y of pre-driver 100 connect to inputs X and Y of driver 50 in FIG. 4A and driver 80 of FIG. 4B. Capacitance C4 is 0.85 fF, i.e., the input capacitance of OCD 50 or OCD 80. Capacitance C1 is the input capacitance 0.030 fF of a 15 NT nanotube switch. Selecting a $C_{OUT}/C_{IN}$ design ratio of 3, the NT switches in pre-driver 100 stages 1-3 and OCD 50 or 80 are summarized in Table 1.

TABLE 1

|  | Stage 1 | Stage 2 | Stage 3 | OCD |
|---|---|---|---|---|
| # NTs in parallel | 15 | 45 | 135 | 425 |
| # NTs Ratio (relative to stage 1) | 1 | 3 | 9 | 28 |
| $C_{IN}$ (fF) | 0.03 | 0.09 | 0.27 | 0.85 |
| $C_{OUT}$ (fF) | 0.09 | 0.27 | 0.85 | 10,000* |
| NT Switch $L_{SUSP}$ (μm) | 0.325 | 0.325 | 0.325 | 0.325 |
| NT Switch Width (μm) | 0.325 | 0.975 | 2.925 | 8.775 |

*10 pf load driven by the OCD using a load pull-up approach shown in FIG. 4A&B

Table 1 shows the NT switch characteristics used at each of the three pre-amplifier 100 stages, stage 1, stage 2, and stage 3. Table 1 also shows the characteristics of the OCD NT output driver (switch) 50 and 80. The load pull-up approach enables an nanotube switching element based OCD to discharge a large 10 pF capacitance, and therefore to drive a large capacitive load directly from an NT switch. However, the fall time is much faster than the rise time (approximately ⅒th) and dc current flows when the driver output node is at ground.

FIGS. 6A-D depict a preferred nanotube switching element 600 in cross-section and layout views and in two informational states. These switches may be used for switches 65, 85 or 90 of FIGS. 4A-B. A more detailed description of these switches may be found in the related cases identified and incorporated above. A brief description follows here for convenience.

Figure 6A:
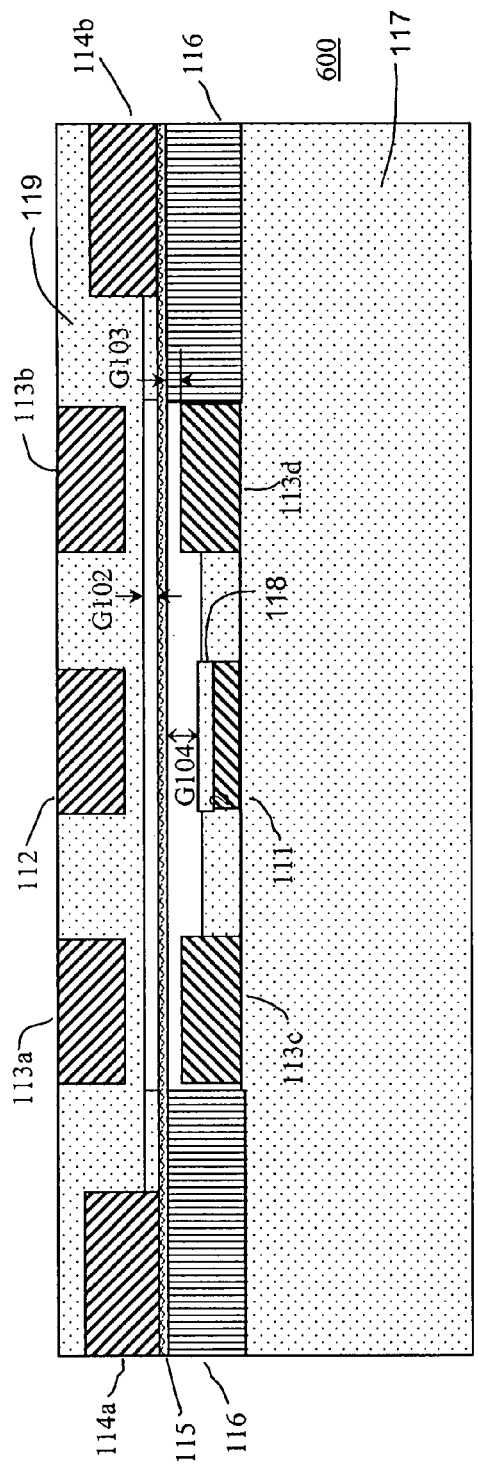
FIGS. 6A-D depict a preferred nanotube switching element in cross-section and layout views and in two informational states.

FIG. 6A is a cross sectional view of a preferred nanotube switching element 100. Nanotube switching element includes a lower portion having an insulating layer 117, control electrode 111, output electrodes 113*c,d*. Nanotube switching element further includes an upper portion having release electrode 112, output electrodes 113*a,b*, and signal electrodes 114*a,b*. A nanotube channel element 115 is positioned between and held by the upper and lower portions.

Release electrode 112 is made of conductive material and is separated from nanotube channel element 115 by an insulating material 119. The channel element 115 is separated from the facing surface of insulator 119 by a gap height G102.

Output electrodes 113*a,b* are made of conductive material and are separated from nanotube channel element 115 by insulating material 119.

Output electrodes 113*c,d* are likewise made of conductive material and are separated from nanotube channel element 115 by a gap height G103. Notice that the output electrodes 113*c,d* are not covered by insulator.

Control electrode 111 is made of conductive material and is separated from nanotube channel element 115 by an insulating layer (or film) 118. The channel element 115 is separated from the facing surface of insulator 118 by a gap height G104.

Signal electrodes 114*a,b* each contact the nanotube channel element 115 and can therefore supply whatever signal is on the signal electrode to the channel element 115. This signal may be a fixed reference signal (e.g., VDD or Ground) or varying (e.g., a Boolean discrete value signal that can change). Only one of the electrodes 114*a,b* need be connected, but both may be used to reduce effective resistance.

Nanotube channel element 115 is a lithographically-defined article made from a porous fabric of nanotubes (more below). It is electrically connected to signal electrodes 114*a,b*. The electrodes 114*a,b* and support 116 pinch or hold the channel element 115 at either end, and it is suspended in the middle in spaced relation to the output electrodes 113*a-d* and the control electrode 111 and release electrode 112. The spaced relationship is defined by the gap heights G102-G104 identified above. For certain embodiments, the length of the suspended portion of channel element 115 is about 300 to 350 nm.

Under certain embodiments the gaps G103, G104, G102 are in the range of 5-30 nm. The dielectric on terminals 112, 111, and 113*a* and 113*b* are in the range of 5-30 nm, for example. The carbon nanotube fabric density is approximately 10 nanotubes per 0.2×0.2 um area, for example. The suspended length of the nanotube channel element is in the range of 300 to 350 nm, for example. The suspended length to gap ratio is about 5 to 15 to 1 for non-volatile devices, and less than 5 for volatile operation, for example.

Figure 6B:
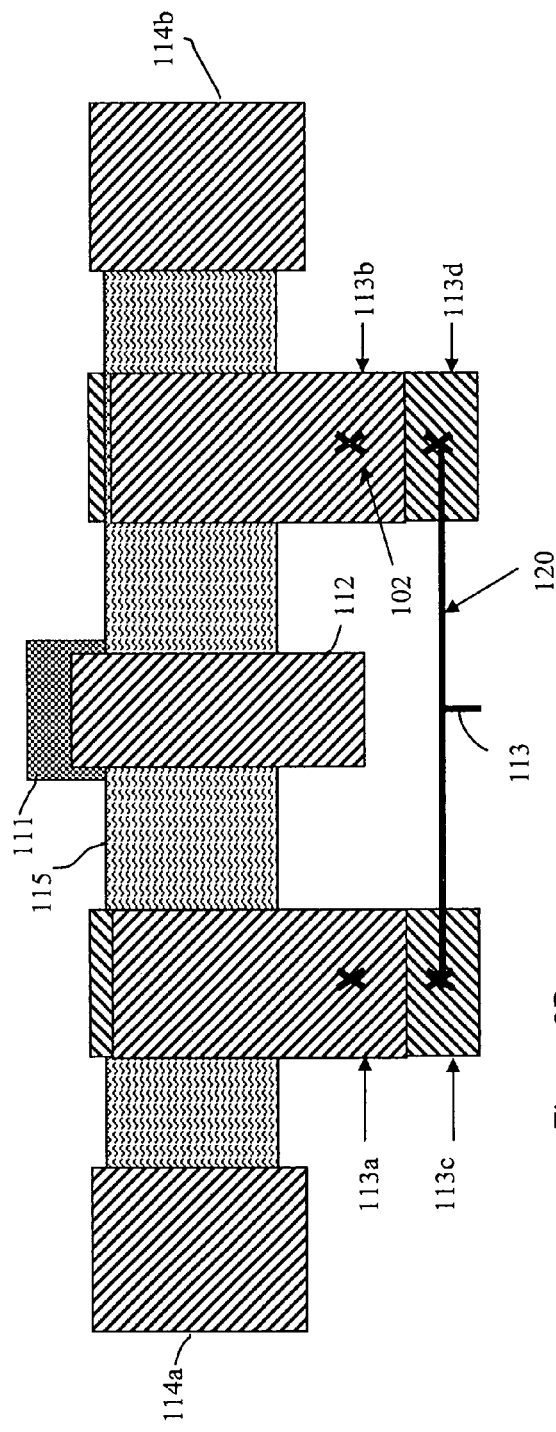

FIG. 6B is a plan view or layout of nanotube switching element 100. As shown in this figure, electrodes 113*b,d* are electrically connected as depicted by the notation 'X' and item 102. Likewise electrodes 113*a,c* are connected as depicted by the 'X'. In preferred embodiments the electrodes are further connected by connection 120. All of the output electrodes collectively form an output node 113 of the switching element 100.

Figure 6C:
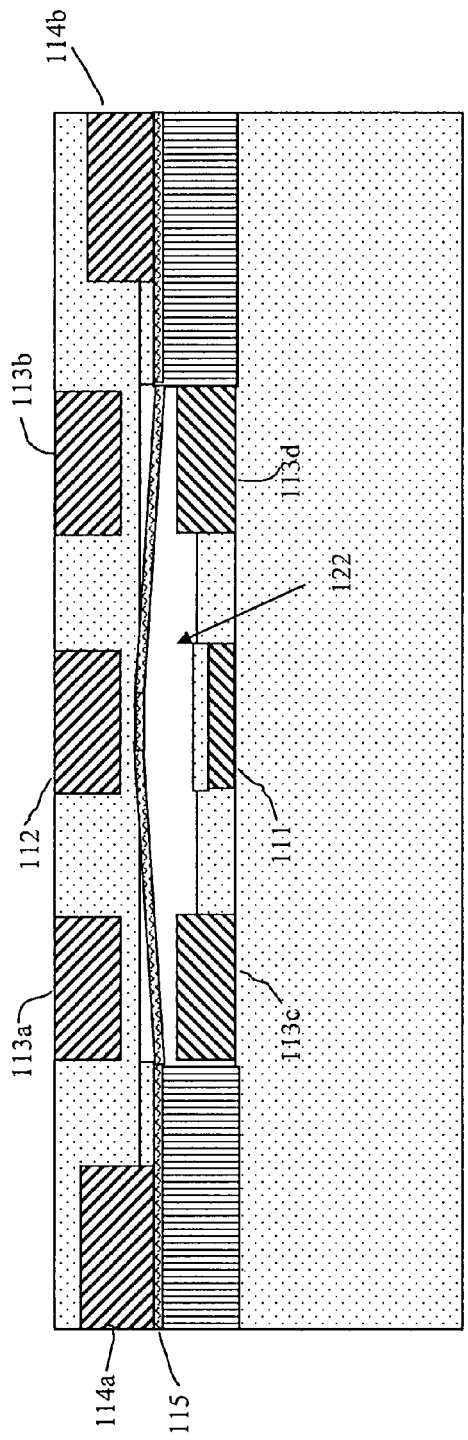
Figure 6D:
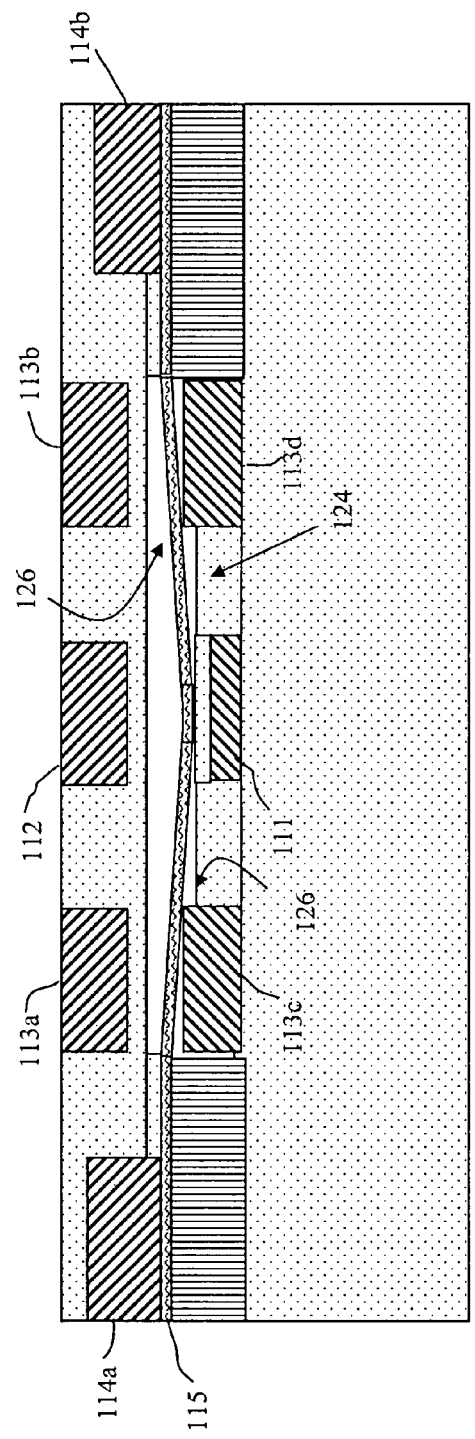

Under preferred embodiments, the nanotube switching element 100 of FIGS. 6A and 6B operates as shown in FIGS. 6C and D. Specifically, nanotube switching element 100 is in an OPEN (OFF) state when nanotube channel element is in position 122 of FIG. 6C. In such state, the channel element 115 is drawn into mechanical contact with dielectric layer 119 via electrostatic forces created by the potential difference between electrode 112 and channel element 115. Output electrodes 113*a,b* are in mechanical contact (but not electrical contact) with channel element 115. Nanotube switching element 100 is in a CLOSED (ON) state when channel element 115 is elongated to position 124 as illustrated in FIG. 6D. In such state, the channel element 115 is drawn into mechanical contact with dielectric layer 118 via electrostatic forces created by the potential difference between electrode 111 and channel element 115. Output electrodes 113*c,d* are in mechanical contact and electrical contact with channel element 115 at regions 126. Consequently, when channel element 115 is in position 124, signal electrodes 114*a* and 114*b* are electrically connected with output terminals 113*c,d* via channel element 115, and the signal on electrodes 114 *a,b* may be transferred via the channel (including channel element 115) to the output electrodes 113*c,d*.

By properly tailoring the geometry of nanotube switching element 100, the nanotube switching element 100 may be made to behave as a non-volatile or a volatile switching element. By way of example, the device state of FIG. 6D may be made to be non-volatile by proper selection of the length of the channel element relative to the gap G104. (The length and gap are two parameters in the restoring force of the elongated, deflected channel element 115.) Length to gap ratios of greater than 5 and less than 15 are preferred for non-volatile device; length to gap ratios of less than 5 are preferred for volatile devices.

The nanotube switching element 101 operates in the following way. If signal electrode 114 and control electrode 111 (or 112) have a potential difference that is sufficiently large (via respective signals on the electrodes), the relationship of signals will create an electrostatic force that is sufficiently large to cause the suspended, nanotube channel element 115 to deflect into mechanical contact with electrode 111 (or 112). (This aspect of operation is described in the incorporated patent references.) This deflection is depicted in FIGS. 6D (and 6C). The attractive force stretches and deflects the nanotube fabric of channel element 115 until it contacts the insulated region 118 of the electrode 111. The nanotube channel element is thereby strained, and there is a restoring tensil force, dependent on the geometrical relationship of the circuit, among other things.

By using appropriate geometries of components, the switching element 100 then attains the closed, conductive state of FIG. 6D in which the nanotube channel 115 mechanically contacts the control electrode 111 and also output electrode 113*c,d*. Since the control electrode 111 is covered with insulator 118 any signal on electrode 114 is transferred from the electrode 114 to the output electrode 113 via the nanotube channel element 115. The signal on electrode 114 may be a varying signal, a fixed signal, a reference signal, a power supply line, or ground line. The channel formation is controlled via the signal applied to the electrode 111 (or 112). Specifically the signal applied to control electrode 111 needs to be sufficiently different in relation to the signal on electrode 114 to create the electrostatic force to deflect the nanotube channel element to cause the channel element 115 to deflect and to form the channel between electrode 114 and output electrode 113, such that switching element 100 is in the CLOSED (ON) state.

In contrast, if the relationship of signals on the electrode 114 and control electrode 111 is insufficiently different, then the nanotube channel element 115 is not deflected and no conductive channel is formed to the output electrode 113. Instead, the channel element 115 is attracted to and physically contacts the insulation layer on release electrode 112. This OPEN (OFF) state is shown in FIG. 6C. The nanotube channel element 115 has the signal from electrode 114 but this signal is not transferred to the output node 113. Instead, the state of the output node 113 depends on whatever circuitry it is connected to and the state of such circuitry. The state of output node 113 in this regard is independent of channel element voltage from signal electrode 114 and nanotube channel element 115 when the switching element 100 is in the OPEN (OFF) state.

If the voltage difference between the control electrode 111 (or 112) and the channel element 115 is removed, the channel element 115 returns to the non-elongated state (see FIG. 6A) if the switching element 100 is designed to operate in the volatile mode, and the electrical connection or path between the electrode 115 to the output node 113 is opened.

Preferably, if the switching element 100 is designed to operate in the non-volatile mode, the channel element is not operated in a manner to attain the state of FIG. 6A. Instead, the electrodes 111 and 112 are expected to be operated so that the channel element 115 will either be in the state of FIG. 6C or 6D.

The output node 113 is constructed to include an isolation structure in which the operation of the channel element 115 and thereby the formation of the channel is invariant to the state of the output node 113. Since in the preferred embodiment the channel element is electromechanically deflectable in response to electrostatically attractive forces, a floating output node 113 in principle could have any potential. Consequently, the potential on an output node may be sufficiently different in relation to the state of the channel element 115 that it would cause deflection of the channel element 115 and disturb the operation of the switching element 100 and its channel formation; that is, the channel formation would depend on the state of an unknown floating node. In the preferred embodiment this problem is addressed with an output node that includes an isolation structure to prevent such disturbances from being caused.

Specifically, the nanotube channel element 115 is disposed between two oppositely disposed electrodes 113b,d (and also 113 a,c) of equal potential. Consequently, there are equal but opposing electrostatic forces that result from the voltage on the output node. Because of the equal and opposing electrostatic forces, the state of output node 113 cannot cause the nanotube channel element 115 to deflect regardless of the voltages on output node 113 and nanotube channel element 115. Thus, the operation and formation of the channel is made invariant to the state of the output node.

Under certain embodiments of the invention, the nanotube switching element 100 of FIG. 6A may be used as pull-up and pull-down devices to form power-efficient circuits. Unlike MOS and other forms of circuits, the pull-up and pull down devices may be identical devices and need not have different sizes or materials. To facilitate the description of such circuits and to avoid the complexity of the layout and physical diagrams of FIGS. 6A-D, a schematic representation has been developed to depict the switching elements.

Figure 7C:
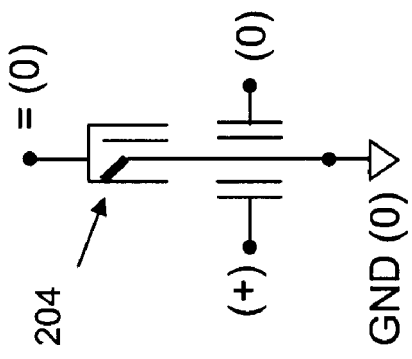
FIGS. 7A-C depict the notation used to describe the nanotube switch and its states.
Figure 7B:
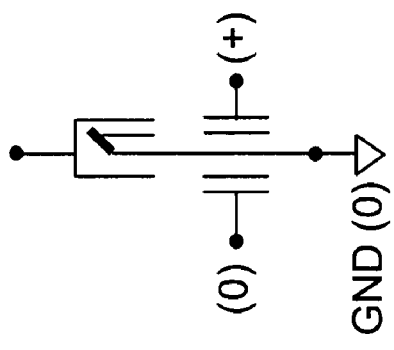
Figure 7A:
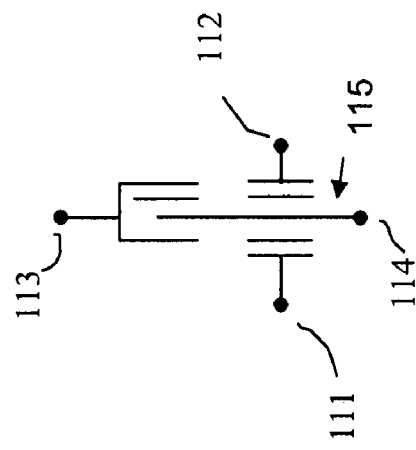

FIG. 7A is a schematic representation of a nanotube switching element 600 of FIG. 6A. The nodes use the same reference numerals.

FIGS. 7B-C depict a nanotube channel element 100 when its signal electrodes is tied to VDD, and its states of operation. For example, FIG. 7B is a schematic representation of the nanotube switching element in the OPEN (OFF) state illustrated in FIG. 6C, in which signal node 114 and the nanotube channel element 115 are at ground, the control electrode 111 is at ground, and the release electrode 112 is at VDD. The nanotube channel element is not in electrical contact with output node 113. FIG. 7C is a schematic representation of the nanotube switching element in the CLOSED (ON) state illustrated in FIG. 6D. In this case, signal node 114 and the nanotube channel element 115 are at ground, the control electrode 111 is at VDD, and the release electrode 112 is at ground. The nanotube channel element is deflected into mechanical and electrical contact with the output node 113. Moreover, if as described above, geometries are selected appropriately, the contact will be non-volatile as a result of the Van der Waals forces between the channel element and the uninsulated, output electrode.) The state of electrical contact is depicted by the short black line 204 representing the nanotube channel element contacting the output terminal 113. This results in the output node 113 assuming the same signal (i.e., VDD) as the nanotube channel element 115 and signal node 114.

As described above, certain embodiments use a nanotube driver scheme where the nanotube driver has the following two states: for a low output voltage, the nanotube driver is activated, and the nanotube driver output is connected to ground through the nanotube fabric discharging the large (10 pf) output capacitor. Also, a dc current flows from voltage source VDDQ through a pullup resistor and nanotube pulldown device to ground for as long as the driver output connected to ground. For a high output voltage, the nanotube driver output is in the open state, cannot discharge the output capacitive load, no dc current flows to ground, and the driver output node does not determine the final output voltage. A resistor that is part of the receiving logic and is connected to a power supply such as VDDQ, for example, charges the large capacitor, thereby setting the high voltage output state. In this approach, the power supply voltage used for the nanotube internal logic may be different than the voltage swing of the output driver, supporting communication between chips (or embedded functions within a chip) operating at different voltages. The size of the nanotube output driver is determined by the nanotube resistance in the "ON" state, which may be in the 50 to 70 ohm range, for example. The input capacitance of the nanotube output driver is substantially larger than the capacitance of typical on-chip nanotube logic circuits and is driven by a pre-driver stage. A pre-driver consists of a chain (several stages) of nanotube inverters of increasing size. The pre-driver uses enough stages such that the last pre-driver inverter stage is strong enough to drive the input capacitance of the nanotube output driver as previously discussed with respect to FIG. 5 and table 1.

The single rail nanotube open-output driver 50 illustrated in FIG. 4A occupies a relatively small area in the output region of a chip or an embedded macro, however, single rail nanotube open-output driver 50 exhibits asymmetrical rise and fall times (fall times approximately ⅒ of rise time), and dissipates standby power because dc current flows through RLOAD and nanotube contact resistance when the driver output electrode is at ground.

Figure 8:
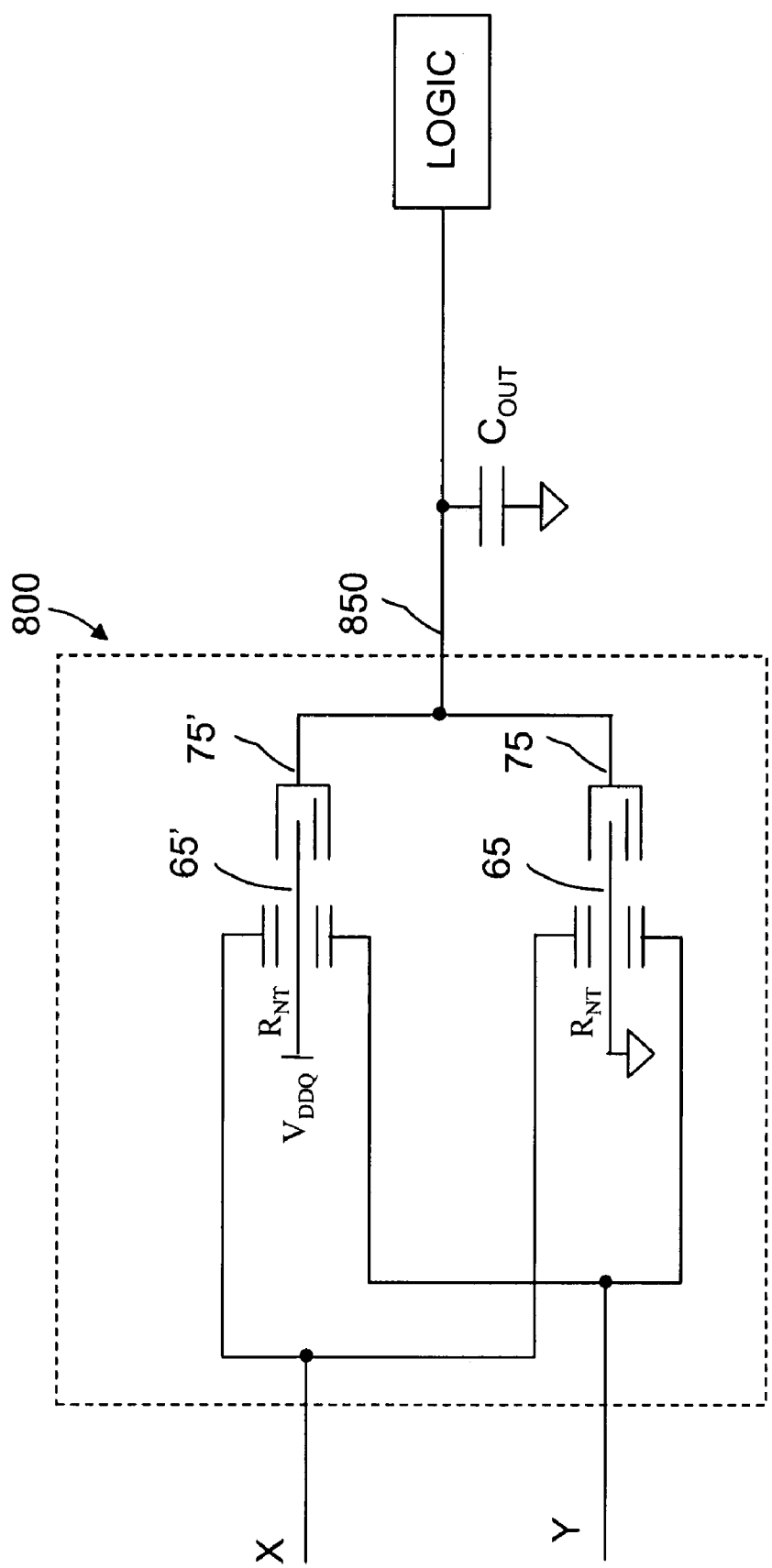
FIG. 8 depicts a single rail, push pull driver circuit according to certain embodiments.

FIG. 8 illustrates nanotube push pull driver 800 in which output load resistor RLOAD 70 has been replaced by an output device 65'. Output device 65' is the same as output device 65 of FIG. 4A, with the nanotube channel element connected to VDDQ instead of ground. Inputs X and Y are true and complement logic inputs similar to inputs X and Y in FIG. 4A. Output electrode 75' of output device 65' is connected to (dotted with) output electrode 75 of device 65 to drive common output 850 connected to parasitic capacitive load COUT and a logic function. Driver 800 output node 850 has the same rise time and fall time (approximately 1.5 ns, for example) and does not dissipate standby power when output node 850 is at ground or at VDDQ.

The dual rail nanotube open-output driver 80 illustrated in FIG. 4B occupies a relatively small area in the output region of a chip or an embedded macro; however, dual rail nanotube driver 80 exhibits asymmetrical rise and fall times and standby power dissipation when output electrode 95 or output electrode 95' is at ground.

Figure 9:
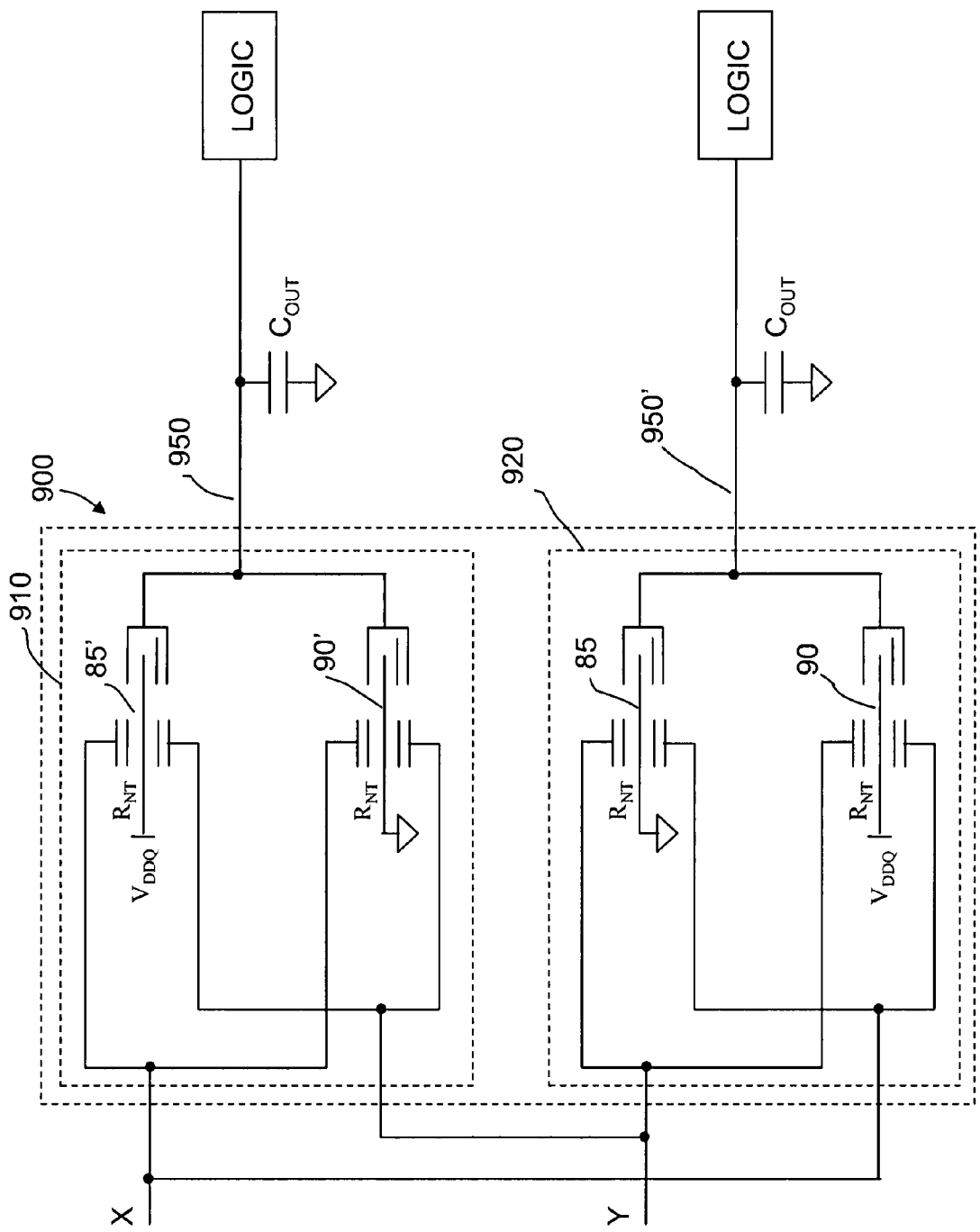
FIG. 9 depicts a dual rail, push pull driver circuit according to certain embodiments.

FIG. 9 illustrates a dual rail nanotube push pull driver in which output resistors RLOAD have eliminated, and dual rail open-output driver 80 has been replaced with dual rail nanotube push pull driver 900. Inputs X and Y are true and complement logic inputs similar to inputs X and Y in FIG. 4B. Dual rail output driver 900 is formed by using two single rail push pull drivers 910 and 920 interconnected as illustrated in FIG. 9. The operation of single rail push pull drivers 910 and 920 are similar to the operation of single rail push pull driver 800. Single rail push pull driver 910 output node 950 drives a first output network with capacitive output load COUT and a logic circuit input connection, and single rail push pull driver 920 output node 950' drives a second output network with a capacitive output load COUT and a logic circuit input connection. Dual rail nanotube push pull driver 900 accepts true and complement logic inputs and provides true and complement logic outputs on output nodes 950 and 950'. Driver output nodes 950 and 950' have the same rise and fall time (approximately 1.5 ns, for example) and do not dissipate standby power when output nodes 950 and 950' are at ground or at VDDQ.

Logic networks may be multiplexed, that is, more than one logic function may drive a network. For example, several logic functions, such as two processors, may share an output bus and drive the bus at different times. Only one logic function may drive a shared network at any point in time. The output driver associated with the active function is activated, and all other drivers connected to the output network are inactive, and are typically in a tristate mode. In a tristate mode, the outputs of unselected drivers are electrically disconnected from power supply and ground, and the voltages on the unselected driver output nodes (connected to the common network) are determined by the activated output driver controlling the bus voltage.

Figure 10:
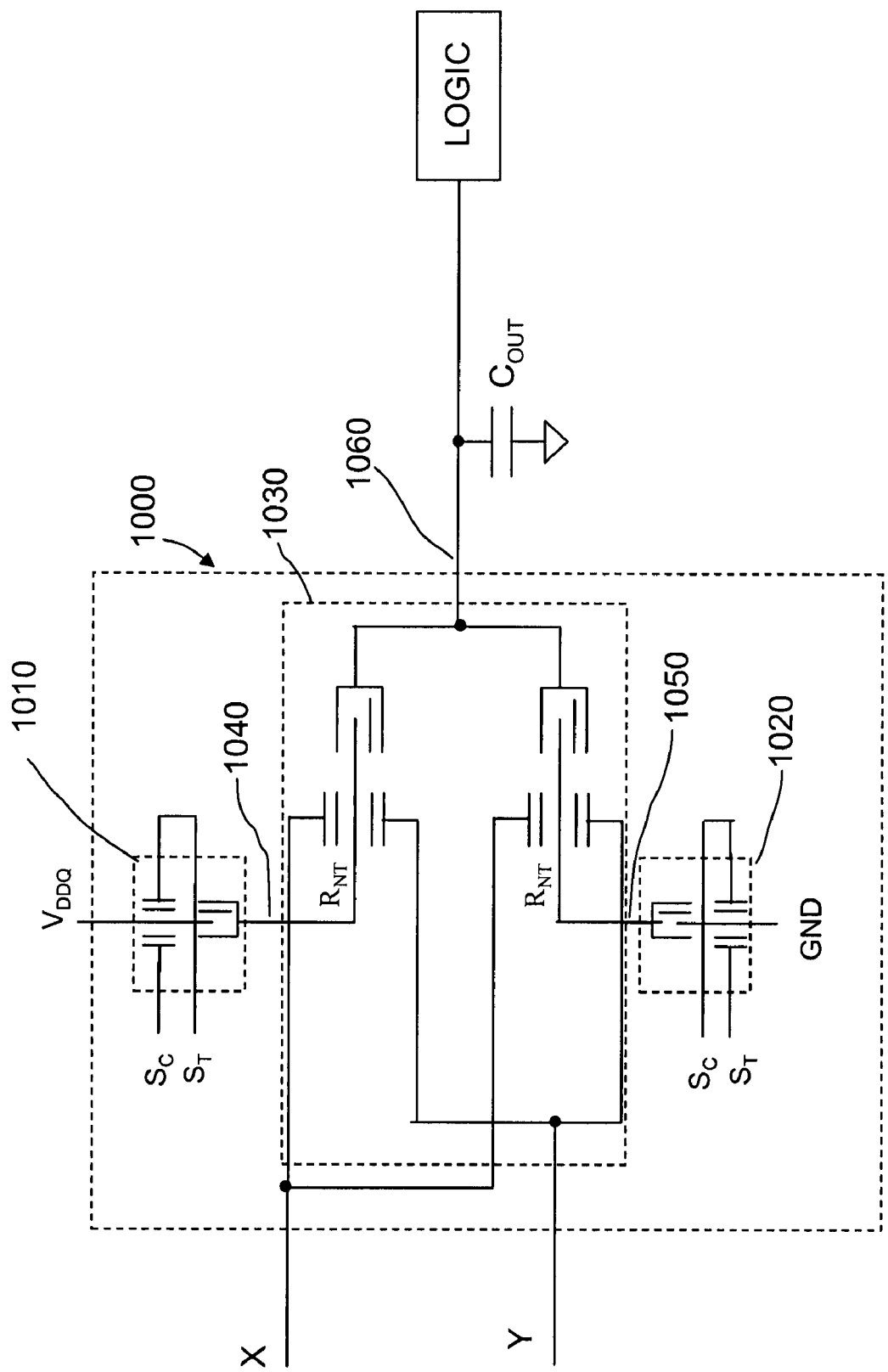
FIG. 10 depicts a single rail, tristate, push pull driver circuit according to certain embodiments.

FIG. 10 illustrates single rail nanotube tristate push pull driver 1000. Tristate driver 1000 consists of tristate circuit 1010, tristate circuit 1020, and single rail push pull driver 1030. The operation of single rail push pull driver 1030 is similar to the operation of single rail push driver 800 illustrated in FIG. 8. Inputs X and Y are true and complement logic inputs similar to inputs X and Y in FIG. 8. Tristate push pull driver output 1060 corresponds to output 850 in FIG. 8. Tristate device 1010 has the nanotube channel element connected to power supply VDDQ, the control gate connected to complement logic input SC, the release gate connected to true logic input ST, and the output node 1040 connected to a first nanotube channel element of push pull driver 1030. Tristate device 1020 has the nanotube channel element connected to ground (GND), the control gate connected to true logic input ST, the release gate connected to complement logic input SC, and the output node 1050 connected to a second nanotube channel element of push pull driver 1030.

In operation, if single rail nanotube tristate push pull driver is in the active state, then tristate devices 1010 is activated such that first nanotube channel element of driver 1030 is connected to voltage source VDDQ, and tristate device 1020 is activated such that second nanotube channel element of driver 1030 is connected to ground. That is, a positive voltage is applied to terminals ST and ground is applied to terminals SC. When tristate devices 1010 and 1020 are in the active (or ON) state, nanotube push pull driver 1030 is active, with output 1060 controlling the state of the corresponding logic network. The resistance path between VDDQ and output node 1060 when driving node 1060 to a positive voltage is the series resistance of tristate device 1010 nanotube channel element plus the series resistance of the first channel element of nanotube push pull driver 1030 plus associated interconnect resistances. The resistance path between ground (GND) and output node 1060 when driving node 1060 to ground is the series resistance of tristate device 1020 nanotube channel element plus the series resistance of the second channel element of nanotube push pull driver 1030 plus associated interconnect resistances. The sizes of devices nanotube devices 1010, 1020, and those of driver 1030 are adjusted as described above with respect to the descriptions associated with FIG. 4 and table 1.

Figure 11:
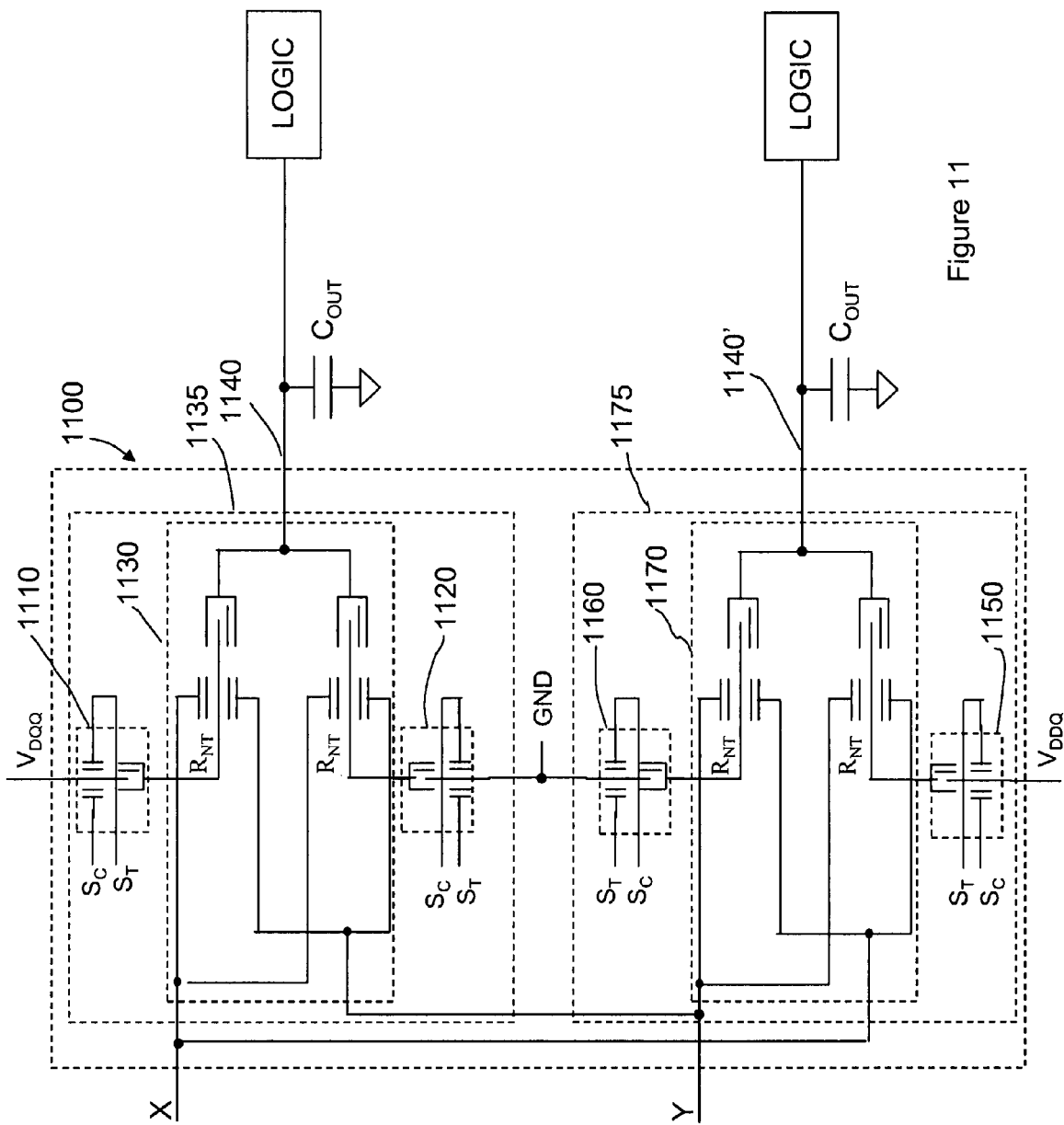
FIG. 11 depicts a dual rail, tristate, push pull driver circuit according to certain embodiments.

FIG. 11 illustrates dual rail nanotube tristate push pull driver 1100. Tristate driver 1100 consists of tristate device 1110, tristate device 1120, single rail push pull driver 1130 forming single rail tristate push pull driver subsection 1135 with output connected to logic network 1140, and tristate device 1150, tristate device 1160, and push pull driver 1170 forming single rail tristate push pull driver subsection 1175 with output connected to logic network 1140', all interconnected as illustrated in FIG. 11. The operation of single rail tristate push pull driver subsections 1135 and 1175 are similar to the operation of single rail tristate push pull driver 1000 shown in FIG. 10. Single rail tristate push pull driver subsection 1135 drives a first logic network 1140 with capacitive output load COUT and a logic circuit input connection, and single rail tristate push pull driver subsection 1175 drives a second logic network 1140' with a capacitive output load COUT and logic circuit input connection. Dual rail nanotube tristate driver 1100 accepts true and complement logic inputs X and Y and true tristate logic input ST and complement logic input SC and provides true and complement logic output on first logic network 1140 and second output network 1140' when in the active (non-tristate mode) with rise and fall times of 1.5 ns, for example and no standby power when output nodes 1140 and 1140' are at ground or VDDQ. Dual rail nanotube tristate driver 1100 is isolated first logic network 1140 and second logic network 1140' when the tristate mode is activated.

Nanotube-based logic may be used in conjunction with and in the absence of diodes, resistors and transistors or as part of or a replacement to CMOS, biCMOS, bipolar and other transistor level technologies. The interconnect wiring used to interconnect the nanotube device terminals may be conventional wiring such as AlCu, W, or Cu wiring with appropriate insulating layers such as $SiO_2$, polyimide, etc, or may be single or multi-wall nanotubes used for wiring.

The inventors envision additional configurations of volatile and nonvolatile or mixed nanoelectromechanical designs depending upon the specific application, speed, power requirements and density desired. Additionally the inventors foresee the use of multiwalled carbon nanotubes or nanowires as the switching element of contact points within the switch.

As the technology node decreases in size from 90 nm to 65 nm and below down to the size of individual nanotubes or nanowires the inventors foresee adapting the basic electromechanical switching elements and their operation to a generation of nanoscale devices with scaleable performance characteristics concomitant with such size reduction.

The nanotube switching element of preferred embodiments utilizes multiple controls for the formation and unformation of the channel. In some embodiments, the device is sized to create a non-volatile device and one of the electrodes may be used to form a channel and the other may be used to unform a channel. The electrodes may be used as differential dual-rail inputs. Alternatively they may be set and used at different times. For example, the control electrode may be used in the form of a clock signal, or the release electrode may be used as a form of clocking signal. Also, the control electrode and release electrode may be placed at the same voltage, for example, such that the state of the nanotube cannot be disturbed by noise sources such as voltage spikes on adjacent wiring nodes.

A FIG. 1 device may be designed to operate as a volatile or non-volatile device. In the case of a volatile device, the mechanical restoring force due to nanotube elongation is stronger than the van der Waals retaining force, and the nanotube mechanical contact with a control or release electrode insulator is broken when the electrical field is removed. Typically, nanotube geometrical factors such as suspended length to gap ratios of less than 5 to 1 are used for volatile devices. In the case of a non-volatile device, the mechanical restoring force due to nanotube elongation is weaker than the van der Waals retaining force, and the nanotube mechanical contact with a control or release electrode insulator remains un-broken when the electric field is removed. Typically, nanotube geometrical factors such as suspended length to gap ratios of greater than 5 to 1 and less than 15 to 1 are used for non-volatile devices. An applied electrical field generating an electromechanical force is required to change the state of the nanotube device. Van der Waals forces between nanotubes and metals and insulators are a function of the material used in the fabrication nanotube switches. By way of example, these include insulators such as silicon dioxide and silicon nitride, metals such as tungsten, aluminum, copper, nickel, palladium, and semiconductors such as silicon. For the same surface area, forces will vary by less than 5% for some combinations of materials, or may exceed 2× for other combinations of materials, so that the volatile and non-volatile operation is determined by geometrical factors such as suspended length and gap dimensions and materials selected. It is, however, possible to design devices by choosing both geometrical size and materials that exhibit stronger or weaker van der Waals forces. By way of example, nanotube suspended length and gap height and fabric layer density, control electrode length, width, and dielectric layer thickness may be varied. Output electrode size and spacing to nanotube may be varied as well. Also, a layer specifically designed to increase van der Waals forces (not shown) may be added during the fabrication nanotube switching element 100 illustrated in FIG. 1. For example, a thin (5 to 10 nm, for example) layer of metal (not electrically connected), semiconductor (not electrically connected), or insulating material may be added (not shown) on the insulator layer associated with control electrode 111 or release electrode 112 that increases the van der Waals retaining force without substantial changes to device structure for better non-volatile operation. In this way, both geometrical sizing and material selection are used to optimize device operation, in this example to optimize non-volatile operation.

The 4-terminal devices of FIG. 1 may also be constructed with a nanotube length to gap size ratio of less than 5 to create a volatile device. This 4-terminal volatile device may also be operated as dual-rail, differential logic but will not preserve the logic state when the power to the circuit is interrupted. A 4-terminal volatile device may be operated as a 3-terminal volatile device if the release electrode is connected to the nanotube channel element through a low resistance electrical path such as a metallization layer. For example, release terminal 112 may be electrically connected to nanotube signal electrode 114. This allows single-rail volatile logic, dual-rail volatile logic, and dual-rail non-volatile logic to be mixed on a single substrate using nanotube switching devices designed for non-volatile operation, and nanotube switching devices designed for volatile operation.

In a complementary circuit such as an inverter using two nanotube switching elements with connected output terminals, there can be momentary current flow between power supply and ground in the inverter circuit as the inverter changes from one logic state to another logic state. In CMOS, this occurs when both PFET and NFET are momentarily ON, both conducting during logic state transition and is sometimes referred to as "shoot-through" current. In the case of electromechanical inverters, a momentary current may occur during change of logic state if the nanotube fabric of a first nanotube switch makes conductive contact with the first output structure before the nanotube fabric of a second nanotube switch releases conductive contact with the second output structure. If, however, the first nanotube switch breaks contact between the first nanotube fabric and the first output electrode before the second nanotube switch makes contact between the second nanotube fabric and the second output electrode, then a break-before-make inverter operation occurs and "shoot-through" current is minimized or eliminated. Electromechanical devices that favor break-before-make operation may be designed with different gap heights above and below the nanotube switching element, for example, such that forces exerted on the nanotube switching element by control and release electrodes are different; and/or travel distance for the nanotube switching element are different in one direction than another; and/or materials are selected (and/or added) to increase the van der Waals forces in one switching direction and weakening van der Waals forces in the opposite direction.

By way of example, nanotube switching element 100 illustrated in FIG. 6A may be designed such that gap G102 is substantially smaller (50% smaller, for example) than gap G104. Also, gap G103 is made bigger such that nanotube element 115 contact is delayed when switching. Also, dielectric thicknesses and dielectric constants may be different such that for the same applied voltage differences, the electric field between release electrode 112 and nanotube element 115 is stronger than the electric field between control electrode 111 and nanotube element 115, for example, to more quickly disconnect nanotube element 115 from output terminals 113c and 113d. Output electrodes 113c and 113d may be designed to have a small radius and therefore a smaller contact area in a region of contact with nanotube element 115 compared with the size (area) of contact between nanotube element 115 and the insulator on control terminal 111 to facilitate release of contact between nanotube element 115 and output electrodes 113c and 113d. The material used for electrodes 113c and 113d may be selected to have weaker van der Waals forces respect to nanotube element 115 than the van der Waals forces between nanotube element 115 and the insulator on release electrode 112, for example. These, and other approaches, may be used to design a nanotube switching element that favors make-before-break operation thus minimizing or eliminating "shoot-through" current as circuits such as inverters switch from one logic state to another.

The material used in the fabrication of the electrodes and contacts used in the nanotube switches is dependent upon the specific application, i.e. there is no specific metal necessary for the operation of the present invention.

Nanotubes can be functionalized with planar conjugated hydrocarbons such as pyrenes which may then aid in enhancing the internal adhesion between nanotubes within the ribbons. The surface of the nanotubes can be derivatized to create a more hydrophobic or hydrophilic environment to promote better adhesion of the nanotube fabric to the underlying electrode surface. Specifically, functionalization of a wafer/substrate surface involves "derivitizing" the surface of the substrate. For example, one could chemically convert a hydrophilic to hydrophobic state or provide functional groups such as amines, carboxylic acids, thiols or sulphonates to alter the surface characteristics of the substrate. Functionalization may include the optional primary step of oxidizing or ashing the substrate in oxygen plasma to remove carbon and other impurities from the substrate surface and to provide a uniformly reactive, oxidized surface which is then reacted with a silane. One such polymer that may be used is 3-aminopropyltriethoxysilane (APTS). The substrate surface may be derivitized prior to application of a nanotube fabric.

Preferred embodiments use the nanotube-based switches of the incorporated, related references. As described therein, many volatile and non-volatile configurations may be used. These switches may then be arranged and sized as described above.

While single walled carbon nanotubes are preferred, multi-walled carbon nanotubes may be used. Also nanotubes may be used in conjunction with nanowires. Nanowires as mentioned herein is meant to mean single nanowires, aggregates of non-woven nanowires, nanoclusters, nanowires entangled with nanotubes comprising a nanofabric, mattes of nanowires, etc. The invention relates to the generation of nanoscopic conductive elements used for any electronic application.

The following patent references refer to various techniques for creating nanotube fabric articles and switches and are assigned to the assignee of this application. Each is hereby incorporated by reference in their entirety:

U.S. patent application Ser. No. 10/341,005, filed on Jan. 13, 2003, entitled Methods of Making Carbon Nanotube Films, Layers, Fabrics, Ribbons, Elements and Articles;

U.S. patent application Ser. No. 09/915,093, now U.S. Pat. No. 6,919,592, filed on Jul. 25, 2001, entitled Electromechanical Memory Array Using Nanotube Ribbons and Method for Making Same;

U.S. patent application Ser. No. 10/033,032, now U.S. Pat. No. 6,784,028, filed on Dec. 28, 2001, entitled Methods of Making Electromechanical Three-Trace Junction Devices;

U.S. patent application Ser. No. 10/033,323, now U.S. Pat. No. 6,911,682, filed on Dec. 28, 2001, entitled Electromechanical Three-Trace Junction Devices;

U.S. patent application Ser. No. 10/128,117, now U.S. Pat. No. 6,835,591, filed on Apr. 23, 2002, entitled Methods of NT Films and Articles;

U.S. patent application Ser. No. 10/341,055, filed Jan. 13, 2003, entitled Methods of Using Thin Metal Layers to Make Carbon Nanotube Films, Layers, Fabrics, Ribbons, Elements and Articles;

U.S. patent application Ser. No. 10/341,054, filed Jan. 13, 2003, entitled Methods of Using Pre formed Nanotubes to Make Carbon Nanotube Films, Layers, Fabrics, Ribbons, Elements and Articles;

U.S. patent application Ser. No. 10/341,130, filed Jan. 13, 2003, entitled Carbon Nanotube Films, Layers, Fabrics, Ribbons, Elements and Articles;

U.S. patent application Ser. No. 10/776,059, filed Feb. 11, 2004, entitled Devices Having Horizontally-Disposed Nanofabric Articles and Methods of Making The Same; and U.S. patent application Ser. No. 10/776,572, now U.S. Pat. No. 6,924,538, filed Feb. 11, 2004, entitled Devices Having Vertically-Disposed Nanofabric Articles and Methods of Making the Same.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A Boolean logic circuit comprising:
at least one logical input; and
a network including a nanotube switching element, a resistor, and a logical output;
the nanotube switching element comprising:
a control structure; and
a nanotube fabric article constructed and arranged to controllably form and unform an electrically conductive pathway between the at least one logical input and the logical output in response to an electrical stimulus on the control structure;
wherein the network is in electrical communication with, and responsive to, the at least one logical input so that the logical output of the network represents a Boolean transformation of the at least one logical input,
wherein the at least one logical input comprises a first logical input and a second logical input; and
wherein the first logical input comprises the logical complement of the second logical input.

2. The Boolean logic circuit of claim 1, wherein the nanotube fabric article is in electrical communication with a reference voltage and wherein the control structure further comprises a set electrode in electrical communication with the first logical input, a release electrode in electrical communication with the second logical input, and an output node in electrical communication with the logical output.

3. The Boolean logic circuit of claim 2, each of the first logical input, the second logical input, and the logical output comprising an electrical stimulus, wherein the combination of electrical stimuli on the release electrode, set electrode, reference voltage and output node cause the nanotube fabric article to electromechanically deflect to form and unform the electrically conductive pathway between the first logical input and the logical output.

4. A Boolean logic circuit comprising:
at least one logical input; and
a network including a nanotube switching element, a resistor, and a logical output;
the nanotube switching element comprising:
a control structure; and
a nanotube fabric article constructed and arranged to controllably form and unform an electrically conductive pathway between the at least one logical input and the logical output in response to an electrical stimulus on the control structure;

wherein the network is in electrical communication with, and responsive to, the at least one logical input so that the logical output of the network represents a Boolean transformation of the at least one logical input, and wherein the Boolean logic circuit is constructed and arranged to drive a capacitance load electrically disposed between the logical output and a low voltage terminal, the capacitance load having a selected charge and discharge rate.

5. The Boolean logic circuit of claim 4, wherein the capacitance load comprises a load of at least 10 pF.

6. A Boolean logic circuit comprising:

a pair of logical inputs; and a network including first and second nanotube switching elements, at least one resistor, and a pair of logical outputs;

each of the first and second nanotube switching elements comprising:

a control structure; and a nanotube fabric article constructed and arranged to controllably form and unform an electrically conductive pathway between the pair of logical inputs and the pair of logical outputs in response to an electrical stimulus on the control structure;

wherein the network is in electrical communication with, and responsive to, the pair of logical inputs so that the pair of logical outputs of the network represent a Boolean transformation of the pair of logical inputs.

7. The Boolean logic circuit of claim 6, wherein when the nanotube fabric article of each of the first and second nanotube switching elements form the electrically conductive pathways, the Boolean transformation of the pair of logical inputs includes an inversion.

8. The Boolean logic circuit of claim 7, wherein the inversion comprises a logical NOT function.

9. The Boolean logic circuit of claim 6, wherein the first of the pair of logical inputs comprises a first logic value and the second of the pair of logical inputs comprises a second logic value, the second logic value being the logical complement of the first logic value.

10. The Boolean logic circuit of claim 9, wherein the first of the pair of logical outputs comprises the second logic value and the second of the pair of logical outputs comprises the first logic value.

11. The Boolean logic circuit of claim 6, wherein for each of the first and second nanotube switching elements: the nanotube fabric article of each is in electrical communication with a reference voltage; and the control structure comprises a set electrode in electrical communication with one of the pair of logical inputs, a release electrode in electrical communication with the other of the pair of logical inputs, and an output node in communication with one of the pair of logical outputs.

12. The Boolean logic circuit of claim 11, wherein one of the pair logical inputs is in electrical communication with the set electrode of the first nanotube switching element and the release electrode of the second nanotube switching element; and wherein the other of the pair of logical inputs is in electrical communication with the release electrode of the first nanotube switching element and the set electrode of the second nanotube switching element.

13. The Boolean logic circuit of claim 6, constructed and arranged to drive at least one capacitance load electrically disposed between one of the pair of logical outputs and a low voltage terminal, the at least one capacitance load having a selected charge and discharge rate.

14. The Boolean logic circuit of claim 13, wherein the at least one capacitance load comprises a load of at least 10 pF.

15. The Boolean logic circuit of claim 6, wherein the first and second nanotube switching elements are nonvolatile.

16. The Boolean logic circuit of claim 6, wherein the first and second nanotube switching elements are volatile.

* * * * *